(12) United States Patent
Wahl

(10) Patent No.: US 7,054,356 B2
(45) Date of Patent: May 30, 2006

(54) METHOD AND APPARATUS FOR TESTING SERIAL CONNECTIONS

(75) Inventor: Mark A Wahl, Windsor, CO (US)

(73) Assignee: Avago Technologies General IP Pte. Ltd., Singapore (SG)

( * ) Notice: Subject to any disclaimer, the term of this patent is extended or adjusted under 35 U.S.C. 154(b) by 800 days.

(21) Appl. No.: 10/109,286

(22) Filed: Mar. 28, 2002

(65) Prior Publication Data

US 2003/0185325 A1    Oct. 2, 2003

(51) Int. Cl.
*H04L 5/16* (2006.01)

(52) U.S. Cl. .................. 375/219; 375/358; 370/503

(58) Field of Classification Search ............... 375/219, 375/220, 354, 358, 372, 373, 376; 370/503, 370/509, 518
See application file for complete search history.

(56) References Cited

U.S. PATENT DOCUMENTS 5,448,598 A *  9/1995  Yousefi et al. .............. 375/376
5,787,114 A *  7/1998  Ramamurthy et al. ...... 375/221
6,331,999 B1 * 12/2001 Ducaroir et al. ............ 375/226
6,771,694 B1 *  8/2004  Baumgartner ............... 375/220

\* cited by examiner

*Primary Examiner*—Dac V. Ha

(57) ABSTRACT

A method and apparatus for testing a serial connection is presented. A serial data stream is transmitted from a sending device to a receiving device. The serial data stream is generated using sending device timing information and input data. A receiver in the receiving device recovers both the timing information and the input data and then inputs them back into a transmitter located in the receiving device. The transmitter in the receiving device then generates a second serial data stream based on the recovered input data and the sending device timing information. A receiver in the sending device receives the second serial data stream and outputs the sending device timing information and input data to a FIFO buffer, for alignment of the input data. Since the input data and timing information are generated based on a sending device timing information, the FIFO can provide a signal for testing by performing phase alignment on the data. There is no need to re-synchronize the data in the sending device. Using the sending device timing information to generate and test information in the sending device, removes the need to test data using a FIFO in the receiving device and reduces the complexity and processing requirements of the FIFO in the sending device.

10 Claims, 3 Drawing Sheets

METHOD AND APPARATUS FOR TESTING SERIAL CONNECTIONS

BACKGROUND OF THE INVENTION

1. Field of the Invention

This invention relates to communication systems. Specifically, the present invention relates to serial communication systems.

2. Description of the Related Art

Serial Communications is a pervasive form of communications. For example, serial communications is used at the chip level to communicate information on a chip, at the device level to communicate information between components in a device and between devices such as computers to communicate information between computers. Serial communications is even used in modern day optical communications systems such as optical repeaters to transfer data between optical devices. Lastly, serial communications is used in disparate applications such as instrumentation or in data acquisition applications such as remote sensing.

There are a variety of parameters that classify a serial communications link. For example, a serial communications link may be classified as simplex meaning that there is one-way communication. Half-duplex, meaning that there is two-way communication, but in one-direction at a time or full duplex, meaning that there is two-way simultaneous communication. In addition, a serial communications link may be classified as asynchronous, meaning that a character is sent whenever a transmitting device is ready or synchronous, meaning that a block of characters are sent at a time.

During asynchronous serial communication a character (6–8 bits) is sent whenever available. The character (e.g. data bits) is typically encoded using a standardized coding scheme (e.g. ASCII). Timing in this type of serial communications is achieved using start and stop bits. In addition, there are several error parameters associated with asynchronous serial communications such as framing errors, overrun errors and parity errors. A framing error occurs when an incorrect stop bit is received. An overrun error occurs when new data is received before the previous data has been processed. Lastly, a parity error denotes that an incorrect parity bit has been received.

In synchronous serial communications, characters are sent one after the other in a block. Each block typically begins with one or more synchronization characters and ends with an end of frame character. A transmitter automatically inserts synchronization or null characters if information is not received fast enough. This helps to ensure synchronization between the transmitter and receiver. During synchronous serial operations, the receiver initially operates in hunt mode, checking the serial data stream until a synchronization character is detected. Once the synchronization character is detected the receiver synchronizes, reading the entire block of data. For large blocks of data, synchronous serial communications typically has less overhead and is therefore more efficient than asynchronous serial communications.

Equipment using serial communications often include a sub-component responsible for managing and performing the serial communications. The sub-component is a combination transmitter/receiver or transceiver. A conventional transceiver system is shown in FIG. 1. In FIG. 1 a sending device 100 communicates with a receiving device 102. A sending device clock 104 provides timing information for the sending device 100. A transmitter 110 receives timing information from a Phase Lock Loop (PLL) 106. The transmitter 110 reformats input data 108 into a serial bit stream 112. A receiver 114 in the receiving device 102, receives the serial bit stream 112. The receiver 114 generates a recovered clock 116 and recovered data 118, from the serial bit stream 112. Both the recovered clock 116 and the recovered data 118 are input into a core 120. The core 120 includes a First-In, First-Out (FIFO) buffer 122 which performs synchronization and frequency adjustment on the recovered data 118 based on a receiving device clock 124. A PLL 126 outputs timing information 128 based on the receiving device clock 124. The FIFO buffer 122 outputs synchronized data 130. The synchronized data 130, local data 132 and a test mode signal 134 are input into a multiplexer 136.

The multiplexer 136 generates multiplexer output data 138. During normal operations, the multiplexer output data 138 is equivalent to the local data 132. During test operation, the test mode signal 134 is made high and the multiplexer output data 138 is equivalent to the synchronized data 130. Timing information 128 which is based on the receiving device clock 124 and the multiplexer output data 138, serve as inputs for transmitter 140. Transmitter 140 generates a serial bit stream 142 based on timing information 128 and multiplexer output data 138. A receiver 144 in the sending device 100, receives the serial bit stream 142 and generates timing information 146 and receiver output data 148. The timing information 146, the receiver output data 148 and timing information output from the sending device clock 104, are input into a FIFO buffer 150. The FIFO buffer 150 then synchronizes the receiver output data 148 and performs a frequency adjustment on the receiver output data 148. FIFO buffer 150 generates FIFO output data 154 for testing. The FIFO output data 154 and the input data 108 are tested using a comparator 156. Indication of the integrity of the data is then output as a pass/fail signal 158.

During test mode, data is transmitted from the sending device 100, using the sending device clock 104 for timing information. The data and timing information are then received and output as recovered timing information 116 and recovered data 118. The recovered timing information 116 and the recovered data 118 are then synchronized to the receiving device clock 124, by the FIFO buffer 122. The synchronization of the recovered data 118, may result in adding and/or deleting data if the sending device clock 104 does not exactly match the receiving device clock 124.

After processing by the FIFO buffer 122, the data is then formatted as the serial bit stream 142, by the transmitter 140, using PLL 126 which received its timing information from receiving device clock 124. When the serial bit stream 142 is received by the sending device 100, timing information 146 and receiver output data 148 are generated. The timing information 146 and the receiver output data 148 are then re-synchronized with the sending device clock 104 in FIFO buffer 150. Since there are often frequency mismatches between the sending device clock 104 and the receiving device clock 124, FIFO buffer 150 has to re-synchronize the receiver output data 148, by adding and/or removing data. The sending device then has to compare the FIFO output data 154 with the input data 108 to determine the integrity of the transmission path. The comparator makes adjustments for the data that may have been added or deleted by the FIFO buffer 122, in the receiving device 102 and the data that may have been added or deleted by the FIFO buffer 150, in the sending device 100.

The processing resulting from the addition and deletion of data in the FIFO buffers 122 and 150, respectively, require complex FIFO buffers in both the sending device and the receiving device. In addition, since the comparator 156, has to take into account, the addition and deletion of data in FIFO buffers 122 and 150, the complexity of comparator 156 is also increased. More complex FIFO buffers and comparators result in an increased number of circuits required to implement these complex devices. Additional circuits take up a significant amount of real estate in an environment where the real estate is at a premium (e.g. a semiconductor chip). Additional circuits also introduce latency in the communications system. Further, the additional complexity introduces more opportunities for points of failure. Lastly, the additional complexity results in performance degradation in the system, since it takes time to perform the processing required by these devices.

As a result, there is a need in the art for a serial communication testing method, in which the receiving device does not have to synchronize the received data. There is a need in the art for a testing method in which the sending device is not required to re-synchronize the received data. There is a need in the art for a serial communication testing method in which the sending device does not have to adjust for the addition/deletion of data due to local clock mismatches. There is a need in the art to implement a serial communications system which minimizes the use of circuit real estate. Lastly, there is a need for a serial communications testing method, which implements a simple FIFO buffer and as a result, avoids the latency that occurs between transmitted data and received data.

SUMMARY OF THE INVENTION

The present invention is directed to a method and apparatus for testing a serial path. A simplified architecture is presented which results in lower complexity and lower system cost, while enhancing system performance. The present invention results in the simplification and in some cases the elimination of several transceiver components.

A transceiver comprises a receiver receiving a first serial bit stream. The first serial bit stream includes timing information generated by a clock. The receiver generates recovered information in response to a first serial bit stream. The recovered information includes the timing information generated by the clock. A timing circuit is coupled to the receiver and generates output timing information in response to the recovered information. The output timing information includes the timing information generated by the clock. A transmitter coupled to the receiver and coupled to the timing circuit generates a second serial bit stream in response to the output timing information. The second serial bit stream including the timing information generated by the clock.

A transceiver comprises a clock generating timing information. A transmitter generates a first serial bit stream in response to the timing information and in response to input data. The first serial bit stream includes the timing information. A receiver is coupled to the transmitter and receives a second serial bit stream including the timing information in response to the first serial bit stream. The receiver generates receiver output information including the timing information in response to the second serial bit stream including the timing information. A buffer is coupled to the receiver and coupled to the clock. The buffer generates buffer output information by performing phase alignment on the receiver output information, wherein the buffer output information is synchronized and phase aligned.

DESCRIPTION OF THE INVENTION

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
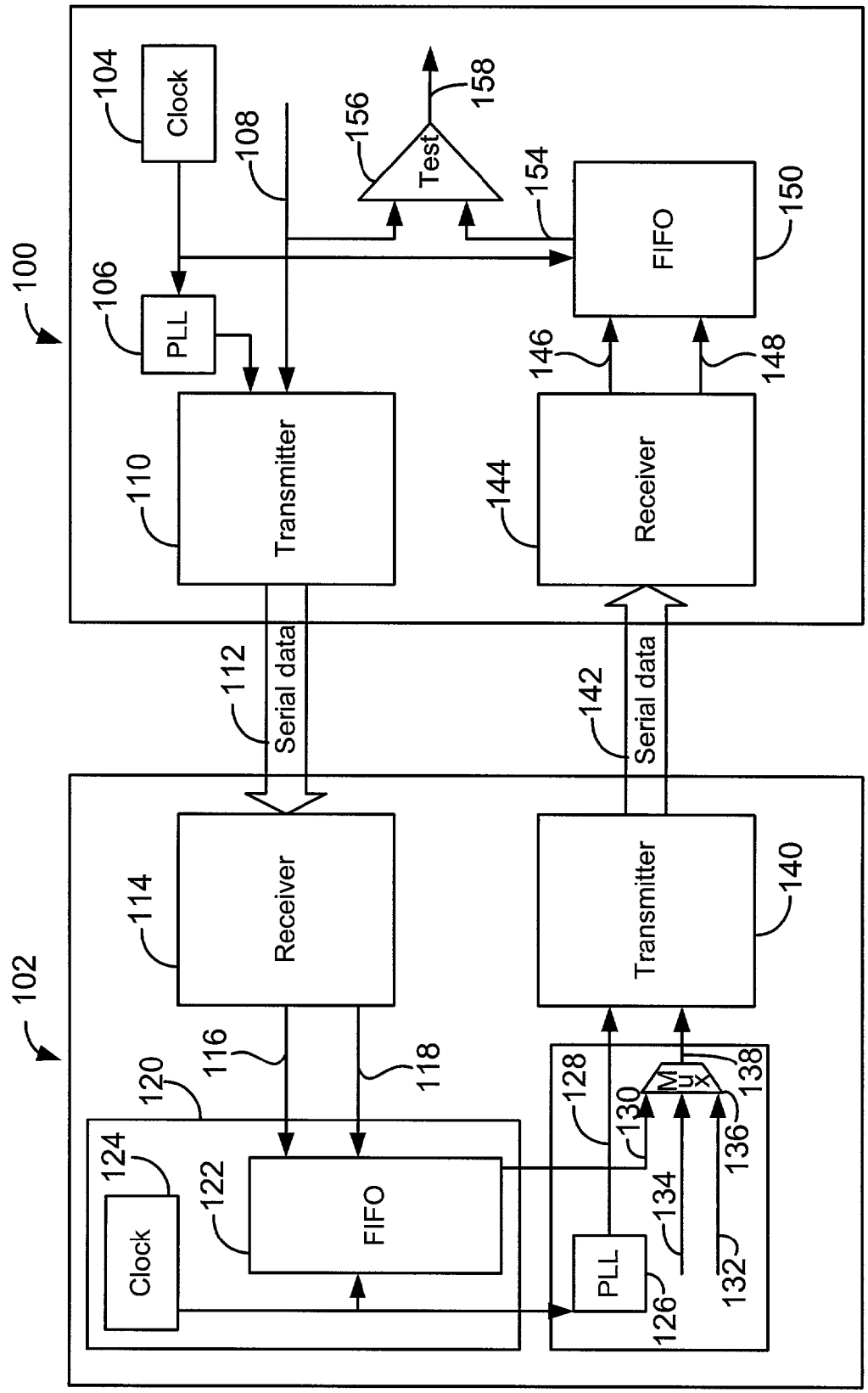
FIG. 1 is a block diagram of a prior art system.
Figure 2:
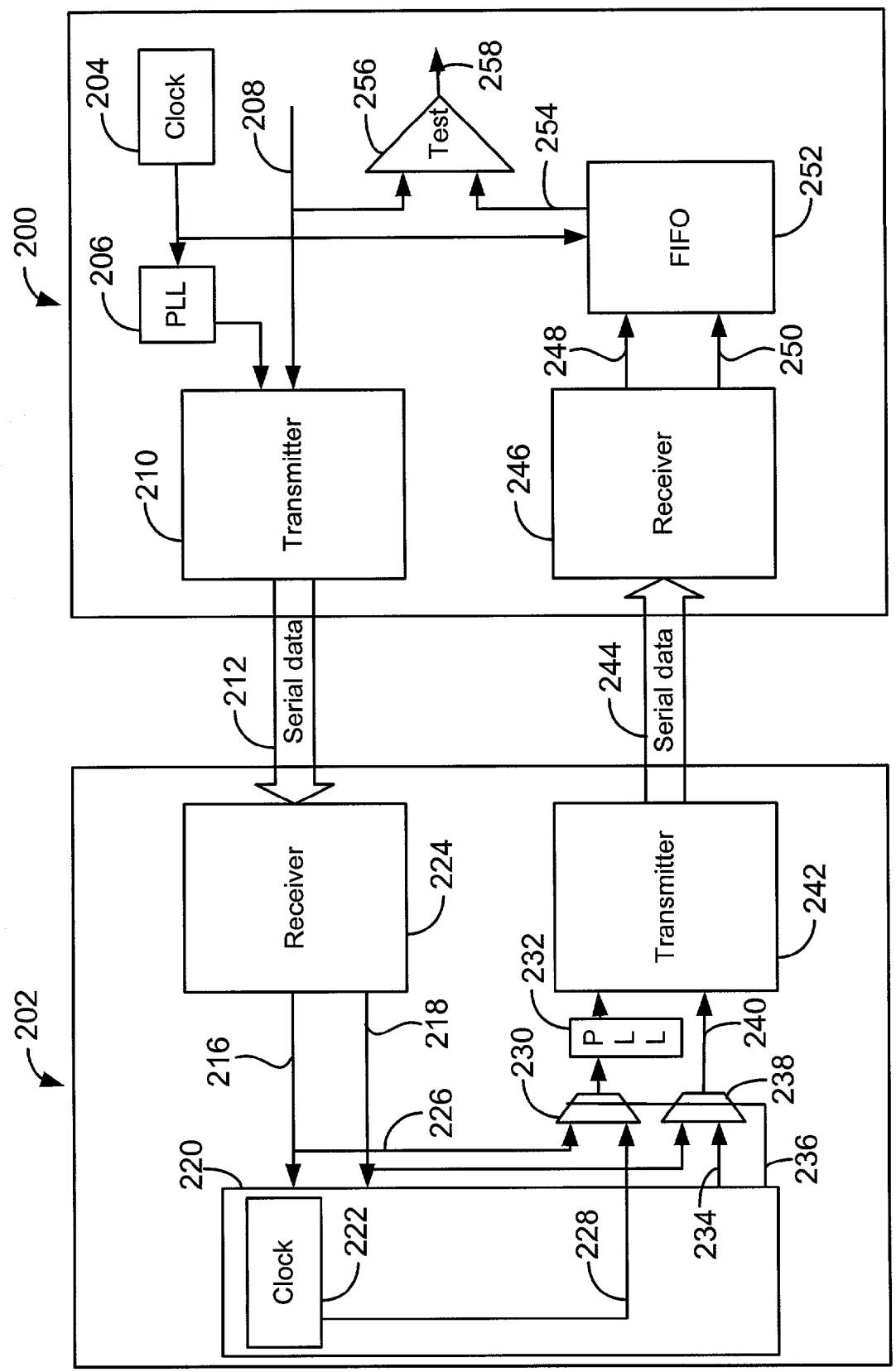
FIG. 2 is a block diagram of the present invention.

A system displaying the method and the apparatus of the present invention is shown in FIG. 2. It should be appreciated that the system shown in FIG. 2 may be implemented in an interface card or in communications equipments such as modern data networking or optical communications equipment.

A sending device 200 includes a reference clock/crystal 204, which maintains the clock for the sending device. The clock provides timing information for a PLL 206 which operates at a multiple of the clock frequency. For example, if the clock is operating at 100 MHZ the PLL may operate at 1 GHZ. The PLL 206 is a timing circuit that synchronizes a signal from an oscillator, with a second input signal called a reference signal so that they operate at the same frequency. The synchronizing oscillator is typically a voltage-controlled oscillator (VCO). The PLL synchronizes the VCO to the reference by comparing their phase and controlling the VCO in a manner that maintains a constant phase relationship between the two. Input data 208 is used by the sending device to test the serial connection link, which includes anything in the transmission path between the sending and receiving device as well as the participating hardware in both devices. The timing output of the PLL 206 and the input data 208 are input into the transmitter 210 in parallel. The transmitter 210 uses the input data 208 and the timing information output by the PLL 206, to produce a forward serial data stream 212, which is transmitted down a medium to a receiving device 202. The forward serial data stream 212 is input into a receiver 224 located in receiving device 202. The receiver 224 generates both a recovered clock 216 and recovered data 218. Both the recovered clock 216 and the recovered data 218 are input into a core unit 220. The core unit 220 includes a receiving device clock 222. The receiving device clock 222 provides the clock and timing information for the receiving device 202.

The core 220 generates sending device timing information 228, sending device data 234 and a test mode signal 236. The recovered clock 216 and the sending device timing information 228 are input into a multiplexer 230. The recovered data 218 and the sending device data 234 are input into a multiplexer 238 which produces output data 240. During test mode, the test mode signal is made high and the multiplexer 230 inputs the recovered clock 216 into PLL 232. In addition, the multiplexer 238 inputs the recovered data 218 into a transmitter 242. The transmitter 242 formats this data into a return serial bit stream 244 and communicates it across a medium to a receiver 246 located in the sending device 200. The PLL 232 uses the recovered clock 218 to generate timing information for the transmitter 242.

During test mode operations, the return serial bit stream 244 is based on timing information from PLL 232, which is based on the recovered clock 216. The receiver 246 reformats the return serial bit stream 244 and outputs timing information 248 and data information 250. Both the timing information 248 and the data information 250 are input into a FIFO buffer 252 which performs a phase alignment of the data. The FIFO 252 outputs synchronized and phase aligned data 254 for testing after phase aligning the data. The synchronized and phase aligned data 254 and the input data 208 are compared in a comparator 256 to ensure the integrity of the communicated data. A pass/fail signal 258 is used to denote the success or failure of the comparator test. The FIFO 252 is capable of outputting data which is both synchronized and phase aligned (e.g. synchronized and phase aligned data 254), by performing phase alignment, since the timing information 248, the return serial bit stream 244, the timing information from the PLL 232, the recovered clock 216 and the forward serial bit stream 212, are all based on the sending device clock 204.

In the method and apparatus of the present invention, the timing information 248 is based on the clock 204. During test mode operations, recovered clock 216 and recovered data 218 are input directly into multiplexers 230 and 240 respectively without processing through the core 220. The return serial bit stream is then based on the recovered clock 216 and the recovered data 218. As a result, the FIFO 252 produces data that is both synchronized and phase aligned (e.g. synchronized and phase aligned data 254) by performing a phase alignment of the data. Since the timing information 248 is based on the return serial bit stream 244 which is ultimately based on the reference clock 204, there is no need to re-synchronize the data information 250, when the communications path is operating properly.

Figure 3:
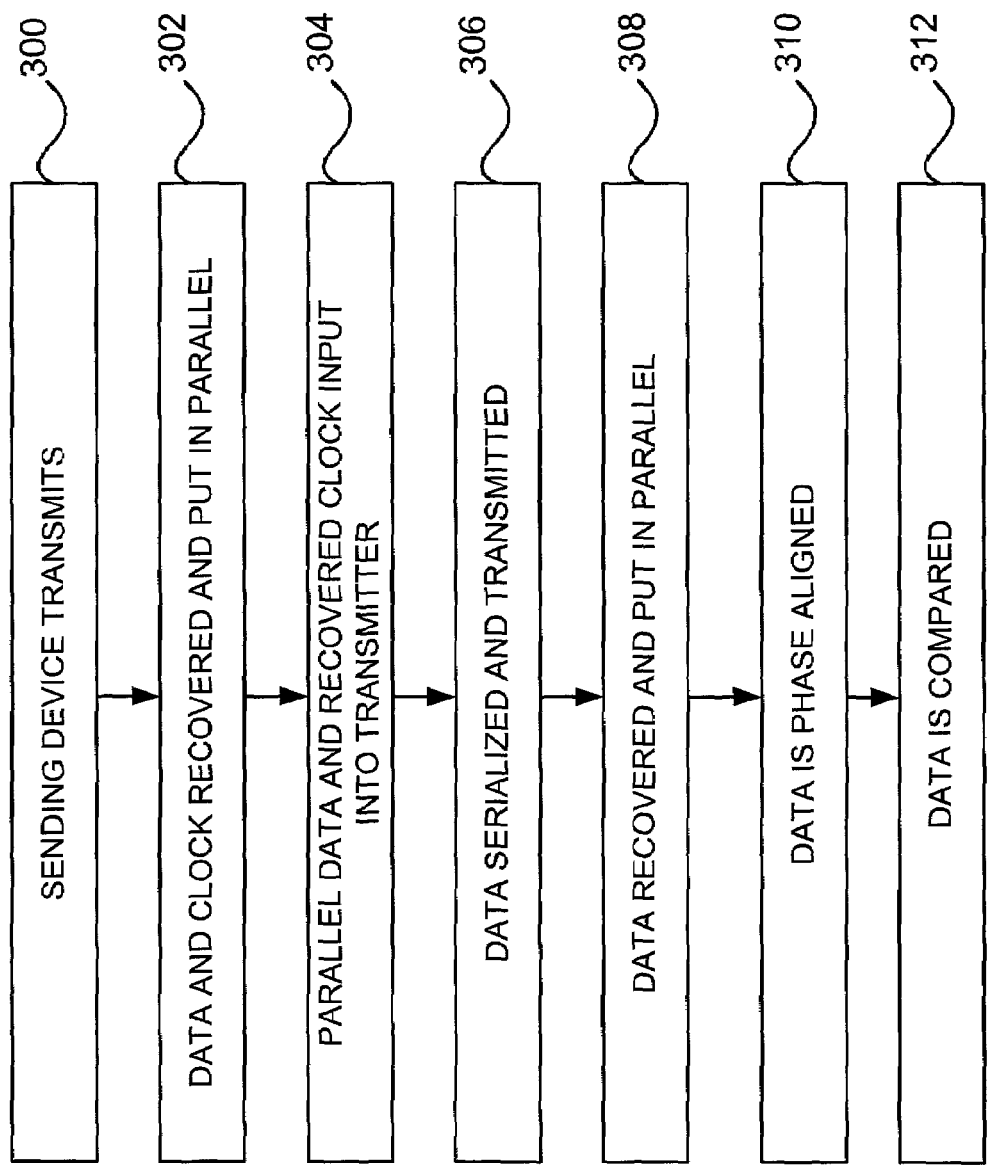
FIG. 3 is a flow diagram of a method of the present invention.

FIG. 3 is a flow diagram of a method of the present invention. In the method of the present invention, data is transmitted serially by the sending device at a multiple frequency of its sending device clock/crystal as shown at 300. The data and the sending device clock are then recovered and formatted in parallel by the receiver in the receiving device as shown at 302. The parallel data and recovered clock are input directly into a transmitter located in the receiving device as shown at 304. The data is then serialized and transmitted by the receiving device at a multiple of the recovered clock as shown at 306. A receiver in the sending device recovers both the data and the sending device clock and inputs the data into a FIFO as shown by 308. The data is then phase aligned to the reference clock as shown at 310. In the method of the present invention, the step of phase aligning shown by 310 produces data that is both synchronized and phase aligned, since the data is based on the sending device clock. Lastly, the sending device compares the data sent with the received data to ensure proper functionality/connection between the two devices as shown at 312.

Thus, the present invention has been described herein with reference to a particular embodiment for a particular application. Those having ordinary skill in the art and access to the present teachings will recognize additional modifications, applications and embodiments within the scope thereof.

It is therefore intended by the appended claims to cover any and all such applications, modifications and embodiments within the scope of the present invention.

What is claimed is:

1. A transceiver comprising:
a receiver receiving a first serial bit stream, the first serial bit stream including timing information generated by a clock, the receiver generating recovered information in response to the first serial bit stream, the recovered information including the timing information generated by the clock;
a timing circuit coupled to the receiver and generating output timing information in response to the recovered information including the timing information generated by the clock, the output timing information including the timing information generated by the clock; and
a transmitter coupled to the timing circuit, the transmitter generating a second serial bit stream in response to the output timing information generated by the clock, the second serial bit stream including the timing information generated by the clock.

2. An interface card comprising the transceiver of claim 1.

3. A communications device comprising the transceiver of claim 1.

4. A transceiver comprising:
a receiver means for receiving a first serial bit stream, the first serial bit stream including timing information generated by a clock, the receiver means generating recovered information in response to the first serial bit stream, the recovered information including the timing information generated by the clock;
a timing means coupled to the receiver means, the timing means for generating output timing information including the timing information generated by the clock in response to the recovered information, the output timing information including the timing information generated by the clock; and
a transmitter means coupled to the timing means, the transmitter means for generating a second serial bit stream in response to the output timing information including the timing information generated by the clock, the second serial bit stream including the timing information generated by the clock.

5. A method of operating a transceiver comprising the steps of:
receiving a first serial bit stream, the first serial bit stream including timing information generated by a clock,
generating recovered information in response to the first serial bit stream, the recovered information including the timing information generated by the clock;
generating output timing information in response to the recovered information, the output timing information including the timing information generated by the clock; and
generating a second serial bit stream in response to the output timing information, the second serial bit stream including the timing information generated by the clock.

6. A transceiver comprising:
a clock generating timing information;
a transmitter generating a first serial bit stream in response to the timing information and in response to input data, the first serial bit stream including the timing information;
a receiver coupled to the transmitter and receiving a second serial bit stream including the timing information in response to the first serial bit stream generated by the transmitter, the receiver generating receiver output information including the timing information in response to the second serial bit stream including the timing information; and
a buffer coupled to the receiver, the buffer generating buffer output information by performing phase alignment on the receiver output information, wherein the buffer output information is synchronized and phase aligned in response to performing the phase alignment on the receiver output information.

7. An interface card comprising the transceiver of claim 6.

8. A communications device comprising the transceiver of claim 6.

9. A transceiver comprising:
   a clock means for generating timing information;
   a transmitter means for generating a first serial bit stream in response to the timing information and in response to input data, the first serial bit stream including the timing information;
   a receiver means coupled to the transmitter means, the receiver means for receiving a second serial bit stream including the timing information in response to the first serial bit stream generated by the transmitter means, the receiver means generating receiver output information including the timing information in response to the second serial bit stream including the timing information; and
   a buffer means coupled to the receiver means, the buffer means for generating buffer output information by performing phase alignment on the receiver output information, wherein the buffer output information is synchronized and phase aligned in response to performing the phase alignment on the receiver output information.

10. A method of operating a transceiver comprising the steps of:
    generating timing information;
    generating a first serial bit stream in response to the timing information and in response to input data, the first serial bit stream including the timing information;
    receiving a second serial bit stream including the timing information in response to the first serial bit stream,
    generating receiver output information including the timing information in response to the second serial bit stream including the timing information; and
    generating buffer output information by performing phase alignment on the receiver output information, wherein the buffer output information is synchronized and phase aligned in response to performing the phase alignment on the receiver output information.

\* \* \* \* \*